United States Patent [19]

Cavaliere et al.

[11] Patent Number: 4,894,562

[45] Date of Patent: Jan. 16, 1990

[54] CURRENT SWITCH LOGIC CIRCUIT WITH CONTROLLED OUTPUT SIGNAL LEVELS

[75] Inventors: Joseph R. Cavaliere, Hopewell Junction; George E. Smith, III, Wappingers Falls, both of N.Y.

[73] Assignee: International Business Machines Corporation, Armonk, N.Y.

[21] Appl. No.: 252,489

[22] Filed: Oct. 3, 1988

[51] Int. Cl.$^4$ ................ H03K 19/086; H03K 19/003; H03K 17/14; H03K 17/16
[52] U.S. Cl. .................................... 307/455; 307/363; 307/542; 307/555; 307/567
[58] Field of Search ............... 307/443, 454, 455, 475, 307/362, 363, 458, 542, 555, 567

[56] References Cited

U.S. PATENT DOCUMENTS

| | | | |
|---|---|---|---|
| 3,501,647 | 3/1970 | Giacomo | 307/455 |
| 3,521,086 | 7/1970 | Slob | 307/237 |
| 3,579,272 | 5/1981 | Foss | 307/218 |
| 3,668,440 | 6/1972 | Davis et al. | 307/310 |
| 3,678,292 | 7/1972 | Hampel | 307/207 |
| 3,746,885 | 7/1973 | Stopper | 307/218 |
| 3,778,646 | 12/1973 | Masaki | 307/455 |
| 3,914,702 | 10/1975 | Geheweller | 330/13 |
| 4,032,800 | 6/1977 | Droscher et al. | 307/296 |
| 4,039,867 | 8/1977 | Blumberg et al. | 307/255 |
| 4,249,122 | 2/1981 | Widlar | 323/313 |
| 4,410,813 | 10/1983 | Barker et al. | 307/362 |
| 4,540,900 | 9/1985 | Early et al. | 307/289 |
| 4,555,642 | 11/1985 | Morales | 307/475 |
| 4,572,970 | 2/1986 | Allen et al. | 307/254 |
| 4,575,647 | 3/1986 | Ashton et al. | 307/455 X |
| 4,584,492 | 4/1986 | Sharp | 307/475 |
| 4,614,882 | 9/1986 | Parker et al. | 307/443 |
| 4,626,771 | 12/1986 | Williams | 323/349 |
| 4,638,818 | 1/1987 | Kimura | 307/297 |
| 4,656,375 | 4/1987 | Lauffer et al. | 307/475 |
| 4,677,320 | 6/1987 | Hannington | 307/567 X |
| 4,678,935 | 7/1987 | Nawata et al. | 307/297 |
| 4,686,395 | 8/1987 | Sato et al. | 307/455 |
| 4,709,169 | 11/1987 | Ashton et al. | 307/455 |
| 4,728,818 | 3/1988 | Chengson et al. | 307/455 X |
| 4,742,292 | 5/1988 | Hoffman | 323/314 |
| 4,752,704 | 6/1988 | Baccarani et al. | 307/573 |
| 4,823,028 | 4/1989 | Lloyd | 307/455 X |
| 4,835,455 | 5/1989 | Coddington et al. | 307/455 X |

OTHER PUBLICATIONS

Bett et al., "Emitter Coupled Logic Circuit", IBM Tech. Discl. Bull., vol. 15, No. 7, pp. 2178-2179, Dec. 1972.

IBM Technical Disclosure Bulletin, vol. 18, No. 5, p. 1418, Oct. 1975, S. D. Malaviya, "Regulated On-Chip Reference Generator for Logic Families".

IBM Technical Disclosure Bulletin, vol. 30, No. 10, pp. 27-29, Mar. 1988, J. R. Cavaliere et al., "Reference Generator Insensitive to Power Supply Variation".

Primary Examiner—Stanley D. Miller
Assistant Examiner—David R. Bertelson
Attorney, Agent, or Firm—Otho B. Ross, III

[57] ABSTRACT

A current switch emitter-follower logic circuit allows both the UP output logic level and the DOWN output logic level to be independently controlled with respect to a fixed reference voltage so as to permit very small output level swings. A feedback circuit generates two different control signals which are independently variable and are input to a control circuit and to a logic circuit to compensate for fluctuations in power supply voltages, temperature and circuit parameters. These control signals are applied to a variable current source within the logic circuit and to a dynamic resistance within the control circuit to compensate almost instantaneously to fluctuations in power supply voltage, temperature or circuit device parameters, maintaining the logic circuit output levels close to reference levels so as to permit small output signal swings. The output logic levels need not be symmetrical around a central reference point.

20 Claims, 4 Drawing Sheets

CURRENT SWITCH LOGIC CIRCUIT WITH CONTROLLED OUTPUT SIGNAL LEVELS

DESCRIPTION

Background of the Invention

The present invention relates to logic circuit networks, and more particularly to a circuit and method for compensating for significant fluctuations in power supply, circuit and environmental parameters. A purpose of the invention is to maintain close control over logic signal levels, in order to permit a reduced output signal swing. Yet more specifically, the invention pertains to a current switch emitter-follower (CSEF) logic circuit network having an associated control circuit which includes a dynamic, controllable resistance and a controllable current source. The resistance and the current source are controlled, respectively, by two independently variable control signals for independently adjusting the CSEF output logic signal levels. The network operates in such a way that the logic UP and DOWN levels of the logic circuit output are held to be essentially constant about a reference voltage with little or no additional power consumption and using a low-voltage power supply, despite significant fluctuations in the power supply voltage, temperature or parameters of the circuit devices. Because of this stability in the UP and DOWN levels, extremely small logic signal levels can be used, thus allowing the circuit switching speed to be increased and the circuit power to be decreased.

Current switch emitter-follower logic circuits are known. Typical prior art CSEF circuits are disclosed in U.S. Pat. Nos. 4,575,647 (FIG. 1), in 4,709,169 (Col. 1), in 3,501,647, and in FIGS. 1 and 2 herein.

A detailed description of the operation of a typical prior art CSEF logic circuit is useful for understanding the present invention. Accordingly, turning to the drawings, FIG. 1 is a simplified block diagram of a logic circuit 1, having logic signal inputs and outputs, power supply voltage input terminals and an optional control signal input. Logic circuit 1 may comprise a standard CSEF circuit (sometimes referred to as emitter coupled logic, or ECL) performing one or more logical functions such as OR, NOR, NAND, etc. This circuit will typically have one or more logical signal inputs and one or two logical signal outputs. In a two-output case, one output will typically be the logical complement of the other. Standard CSEF circuits, being active devices, also require one or more sources of power for operation, which are normally supplied by positive and negative voltages from a power supply, commonly designated as $V_{CC}$ and $V_{EE}$. Other voltages, sometimes called reference voltages, $V_T$ and $V_{Ref}$, are also supplied, generally from the same power supply. $V_{Ref}$ could also be of ground potential.

The various inputs, outputs and voltage attachments of the prior art logic circuit 1 are shown in more detail in FIG. 2. In the circuit of FIG. 2, which illustrates an n-input OR/NOR gate, input transistors 12, 14 and 16 are provided in a parallel configuration for receipt of one or more logical signal inputs. Although three input transistors are shown, a greater or lesser number may be employed. The bases of transistors 12, 14 and 16 are connected to input terminals $IN_1$, $IN_2$ ... $IN_n$ for receipt of the input logic signals, which are typically binary signals arbitrarily designated as UP or DOWN.

The commonly connected collectors of transistors 12, 14 and 16 are coupled through a resistor 26 to a terminal to which a positive power supply voltage $V_{CC}$ is applied. Transistors 12, 14 and 16 are connected in a differential amplifier configuration with a fourth transistor 18, the collector of which is coupled through a resistor 28 to the $V_{CC}$ terminal. The base of transistor 18 is connected to a first logic level reference voltage $V_{Ref}$, here assumed to be ground although other potentials may be used. The emitters of all four transistors 12, 14, 16 and 18 are commonly connected to the collector of a fifth transistor 22, the latter device serving as a constant current source for the differential amplifier circuit. The emitter of transistor 22 is connected through a resistor 32 to a second power supply terminal to which a negative supply voltage $V_{EE}$ is applied. A second logic level reference voltage or control signal $V_{CS}$ may be applied to the base of transistor 22. In some prior art circuits, signal $V_{CS}$ may be used to provide limited control over the DOWN level of the output signals.

Two output transistors 10 and 20 are typically provided in the prior art circuit of FIG. 2, both of these being connected in an emitter-follower configuration with their emitters coupled through resistors 24 and 30, respectively, to another, secondary power supply voltage terminal, $V_T$. The base input to transistor 10 is supplied from the commonly connected collectors of transistors 12, 14 and 16, while the base input to transistor 20 is supplied from the collector of transistor 18. The emitters of the transistors 10 and 20 are connected to output terminals $OUT_1$ and $OUT_2$, respectively.

The operation of the circuit of FIG. 2 is well known. When at least one of the input signals applied to the terminals $IN_1$, $IN_2$ ... $IN_n$ is in the UP (positive) level, the corresponding transistor 12, 14, or 16 is turned on, thereby causing most of the current which flows through the constant current source transistor 22 to flow through the respective transistor 12, 14 or 16 and the resistor 26. Transistor 18 is then off and transistor 20 on, thereby causing the output signal on the terminal $OUT_2$ to be at the UP level. The voltage at the base of transistor 10 is lower than the voltage at the base of transistor 20, and therefore terminal $OUT_1$ is at the DOWN level. In this manner, the logical OR of the signals on the input terminals $IN_1$, $IN_2$ ... $IN_n$ is produced on the 10 terminal $OUT_2$ and the logical NOR of those signals on the terminal $OUT_1$.

In a typical CSEF logic network, many circuits such as the one shown in FIG. 2 are contained on a single integrated circuit chip. Power is supplied from a remote power supply located "off-chip". The power supply voltages $V_{CC}$, $V_{EE}$, $V_T$ and $V_{Ref}$, usually all taken from the same supply, are normally intended to be held constant, but in practice some fluctuations will occur since these voltages provide large variable currents to a large number of logic circuits. A typical fluctuation in a nominal value of +1.4 volts for $V_{CC}$ might be ±85 mv. Fluctuations in $V_{CC}$ and/or $V_{EE}$ will, in turn, give rise to fluctuations (noise) in the output levels of the logic circuits, adversely affecting circuit performance.

Because of these fluctuations, the relative UP and DOWN output levels at transistors 10 and 20 of the prior art circuits must be kept rather high, typically on the order of ±350 mv, to overcome the power supply noise and coupled signal noise to ensure successful communication between circuits on the chip. This, in turn, has a tendency to limit the switching speed of the circuit because large signal swings generally require longer turn-on and turn-off times for the circuit components. Fluctuations in environmental factors, such as temperature, and in circuit component parameters, such as resistance and transistor gain, also adversely affect the performance of the circuit by requiring large signal swings to overcome this type of noise.

Different schemes have been proposed in the prior art for stabilizing or compensating for fluctuations in the primary power supply voltages $V_{CC}$ or $V_{EE}$ or for fluctuations in temperature or device parameters. These schemes typically employ either a current source controller, a voltage divider or a Schottky barrier diode clamp. Only partial compensation, however, is achieved, or other disadvantages are present, either because changes in $V_{CC}$ or other voltages cannot be accurately tracked, or only a center reference level is tracked, or only one of the two logic output levels may be adjusted, or no accurate temperature or device parameter compensation is achieved, or a relatively high voltage power supply must be used.

In Ashton et al. U.S. Pat. No. 4,575,647, a control signal $V_{CS}$ is generated for input to the base of the current source transistor (such as transistor 22 in the prior art circuit of FIG. 2 herein). This signal, together with back-to-back Schottky barrier diodes, causes the output UP and DOWN levels to be symmetrical fashion. A drawback of this approach, however, is that only one point of control is provided. Merely varying $V_{CS}$ by itself does not permit the independent tracking and control of each output level. Also, a symmetrical output is not always advantageous, and the use of a single control signal does not permit full compensation for all changes in $V_{CC}$, temperature or device parameters. In addition, the output signal cannot be reduced below the forward drop of the diode 44 of that patent.

Ashton et al. U.S. Pat. No. 4,709,169 discloses a different circuit and method for controlling CSEF output levels. There, extra current is drawn, as needed, through resistors 26 or 30 of FIG. 1 (analogous to resistors 26 and 28 of FIG. 2 herein). A Schottky barrier diode is also employed. A disadvantage of this scheme, however, is that extra capacitance is added to the critical output nodes 10 and 12 of FIG. 1 (analogous to the bases of transistors 10 and 20 of FIG. 2 herein). Another disadvantage is that extra power is required to drive this circuit.

Other output level control devices are described in Masaki U.S. Pat. No. 3,778,646 and in Betts et al., "Emitter-Coupled Logic Circuit", *IBM Technical Disclosure Bulletin*, Vol. 15, No. 7, Dec. 1972, at pp. 2178–79. These devices, however, suffer from various disadvantages such as the inability to compensate for changes in the $V_{CC}$ supply or the inability to independently control both the UP and DOWN levels.

Thus, because the prior art regulatory schemes do not fully compensate for changes in power supply levels, temperature or device parameter fluctuations, the UP and DOWN levels produced by the circuits must be kept relatively large with respect to the logic signal reference level (ground in the case of the circuit of FIG. 2 herein). This is, of course, undesirable in that the nominal noise margin and consequently the speed of the circuit is adversely affected.

The present invention is intended to remedy the above-mentioned disadvantages, and provide a current switch logic circuit, the output signal swing of which is reduced to a minimum and the UP and DOWN levels are made substantially insensitive to power supply voltage fluctuations, junction temperatures and absolute device parameters. Thus, maximum speed and minimum power dissipation are achieved simultaneously.

SUMMARY OF THE INVENTION

Briefly, the present invention comprises a logic circuit network for producing an adjustable first logic level and a different adjustable second logic level in response to at least one input signal, comprising: a logic circuit having at least one input terminal, an output terminal, a complement output terminal, at least one power supply terminal for receiving power, circuit components having parameters and a first control terminal; a control circuit coupled to the logic circuit and having a second control terminal; means for independently generating a responsive to changes in the power supply, temperature and logic circuit component parameters; and means for supplying the control signals to the first and second control terminals, respectively, so as to maintain the first and second logic levels at different predetermined reference levels despite changes in the power supply, temperature and logic circuit component parameters.

In a preferred embodiment of the present invention, the control circuit comprises: a load resistor; a controllable dynamic resistance connected across the resistor, comprising one or more transistors of one type; a controllable current amplifier comprising one or more transistors of the opposite type, connected to control the dynamic resistance; and means for applying a signal to the current amplifier to change the dynamic resistance in order to keep a logic signal level constant with respect to a reference voltage.

In a further embodiment of the present invention, the logic circuit comprises a compensated current switch emitter-follower circuit having a controllable current source coupled to a differential amplifier configuration driving emitter-follower output transistors. The first and second control signals, input to the logic circuit and control circuit respectively, are generated by a control signal generator including circuits employing logic level reference and sample generators in a feedback loop arrangement.

The present invention further includes a method for producing an adjustable first logic level and a different adjustable second logic level in response to at least one input signal, comprising the steps of: generating a first control signal and a second control signal, each of which is a function of at least one power supply voltage, temperature and parameters of circuit devices; and independently controlling the first and second logic levels by way of the first and second control signals, respectively, so as to maintain the first and second logic levels at different predetermined reference levels.

The use of the feedback controlled signal generator and the dynamic resistance holds the UP and DOWN output logic levels independent of power supply and environmental conditions over a significant range. This allows the nominal output signal swing to be reduced without reducing the worst case signal swing. In addition, the output levels need not be symmetrical with respect to any reference level, and relatively low power supply voltages may be used. In simulation, it has been found that the reduced signal swing can thus permit the circuit to easily achieve a 20% performance (speed) improvement over standard CSEF logic circuits.

DETAILED DESCRIPTION OF THE PREFERRED EMBODIMENTS

Figure 3:
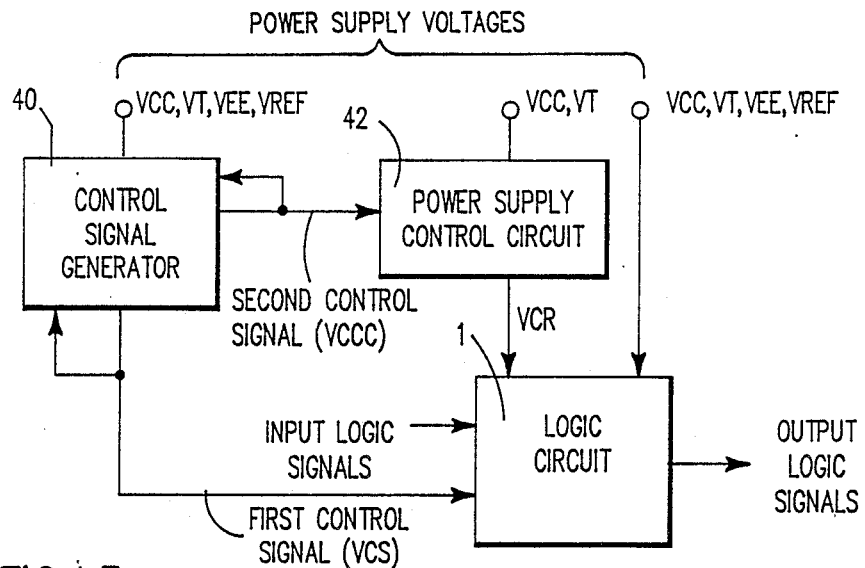
FIG. 3 is a block diagram of one embodiment of the present invention.

Referring now to FIG. 3, there is shown therein a functional block diagram of one embodiment of the present invention. The present invention is not, however, limited to this particular configuration.

Figure 1:
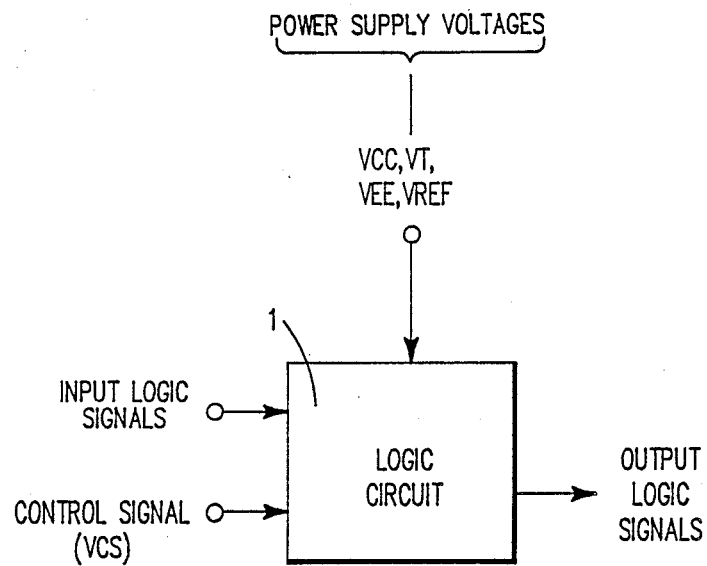
FIG. 1 is a block diagram of a typical prior art CSEF logic circuit.

In FIG. 3, logic circuit 1 provides one or more logic signal outputs in response to one or more logic signal inputs, in an arrangement similar to that shown in FIG. 1. Powering this logic circuit are primarily power supply voltages $V_{CC}$, $V_{EE}$, $V_T$ and $V_{Ref}$. Normally, $V_{Ref}$ is ground. The difference between $V_{CC}$ and $V_{EE}$ may, for example, be on the order of 3 volts, and the difference between $V_{CC}$ and $V_T$ may, for example, be on the order of 2 volts.

Figure 2:
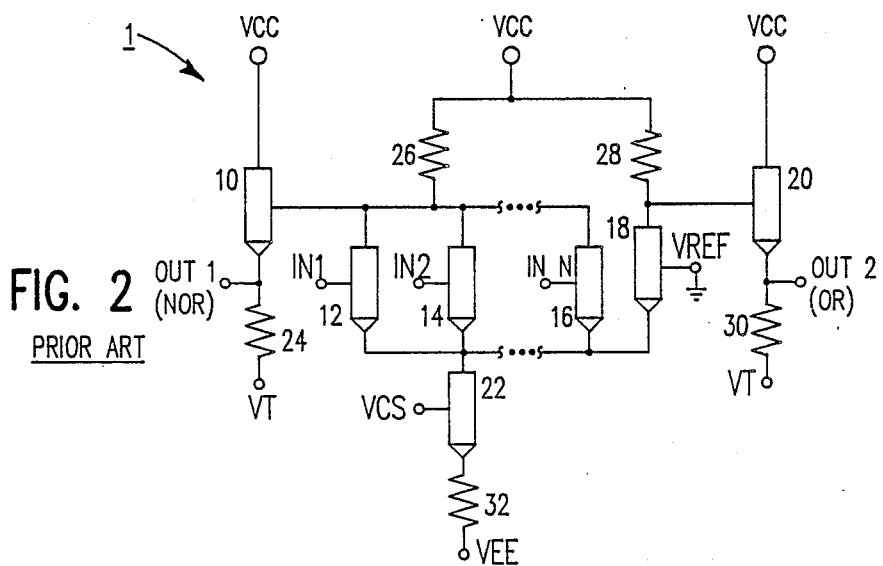
FIG. 2 is a schematic circuit diagram of the logic circuit of FIG. 1.
Figure 4:
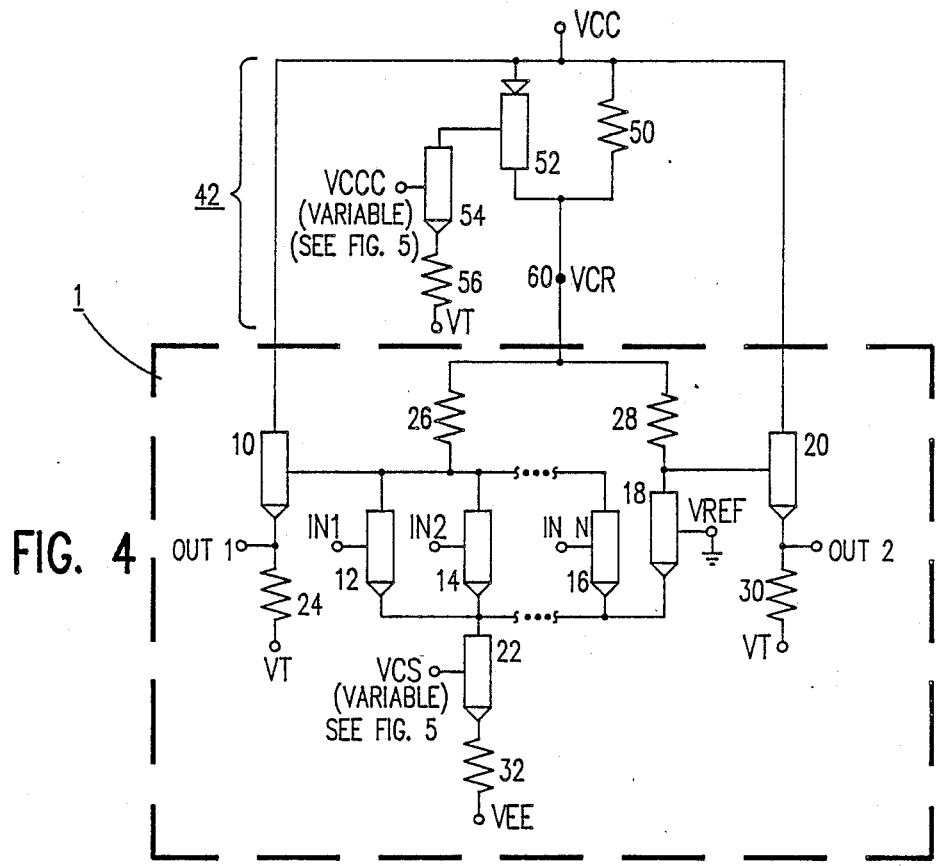
FIG. 4 is a schematic circuit diagram of one embodiment of FIG. 3.

A feature of the present invention is the use of a power supply control circuit 42. Control circuit 42 may be powered by the same $V_{CC}$ and $V_T$ voltages that are used to power logic circuit 1, thus not requiring a large or separate power supply. Control circuit 42 provides a fifth voltage input $V_{CR}$ to logic circuit 1. In one specific embodiment, as best seen in FIG. 4, this fifth voltage input $V_{CR}$ is supplied from a node 60 to resistors 26 and 28 of the logic circuit 1. As can be seen by comparing FIG. 4 to FIG. 2, this arrangement is a departure from prior art arrangements in which resistors 26 and 28 receive only the standard primary power supply voltage, $V_{CC}$, the same voltage applied to the collectors of output transistors 10 and 20.

Voltage input $V_{CR}$ at node 60 is a stabilized substitute for the fluctuating $V_{CC}$, $V_{CR}$ being held constant by the power supply control circuit 42. In the embodiment of FIG. 3, this control circuit has three inputs—a primary power supply voltage $V_{CC}$, a secondary power supply voltage $V_T$, and a second control signal $V_{CCC}$, another feature of the invention. The voltage $V_{CR}$ is thus a function of the inputs $V_{CC}$, $V_T$ and $V_{CCC}$.

Second control signal $V_{CCC}$, which may be a variable voltage, is generated by yet another feature of the invention, a control signal generator 40 (see FIG. 3). Signal generator 40 also generates a first control signal $V_{CS}$, which may also be a variable voltage, for input to the logic circuit 1. Inputs to signal generator 40 are the standard power supply voltages $V_{CC}$, $V_T$, $V_{EE}$ and $V_{Ref}$. Signals $V_{CCC}$ and $V_{CS}$ are also fed back into signal generator 40 to form closed feedback loops.

Control signals $V_{CCC}$ and $V_{CS}$ fluctuate in response to fluctuations in $V_{CC}$, $V_{EE}$, $V_T$, $V_{Ref}$, temperature and parameters of the components making up logic circuit 1.

The primary purpose of $V_{CCC}$ is to control the UP output logic level of logic circuit 1 with respect to $V_{Ref}$, and the primary purpose of $V_{CS}$ is to control the DOWN output level with respect to $V_{Ref}$. Therefore, the difference between the signal levels is also controlled. Each control signal influences both levels by virtue of the feedback arrangement of signal generator 40. Control signals $V_{CCC}$ and $V_{CS}$, together with control circuit 42 and its output $V_{CR}$, thus accomplish the voltage, temperature and device parameter stabilizing functions of the present invention so as to maintain the output logic levels of logic circuit 1 extremely close to their ideal, preselected reference levels. Normally, these "ideal" levels are selected to be as small as possible to allow faster operation.

One embodiment of a particular circuit arrangement of the control circuit 42 is shown in FIG. 4. In FIG. 4, the dotted portion of the circuit represents a typical prior art CSEF circuit, such as that shown in FIG. 2, except that the voltage $V_{CR}$ at node 60 now replaces the $V_{CC}$ connection. In the present invention, as mentioned above, the terminal for power supply voltage $V_{CC}$ is not connected to resistors 26 and 28, as in the prior art. Instead, a load resistor 50 and a first control transistor 52 are provided in a parallel configuration between the $V_{CC}$ terminal and node 60 which, in turn, is connected to resistors 26 and 28. In a preferred embodiment, transistor 52 is a bipolar transistor, preferably of a type opposite to the type employed in the logic circuit (i.e., transistors 10, 12, 14, 16, 18, 20 and 22). Here, transistor 52 is of the PNP type, while transistor 10, 12, 14, 16, 18, 20 and 22 are of the NPN type. In addition, transistor 52 is emitter coupled to the $V_{CC}$ terminal, is collector coupled to node 60 and is configured to operate as a dynamic resistance in response to a signal at its base.

A second control transistor 54 has its collector coupled to the base of transistor 52. The emitter of transistor 54 is connected to a resistor 56 and then to one of the secondary power supply voltage terminals, $V_T$. The base of transistor 54 receives the first variable control signal $V_{CCC}$ from control signal generator 40.

Transistor 54 acts as a current amplifier and provides additional amplification for the $V_{CCC}$ signal, but is not essential for the operation of the circuit if the beta (gain) of transistor 52 is high (i.e., above 60). In practice, such a high beta is difficult to achieve for an integrated PNP transistor, but if available, then control signal $V_{CCC}$ may, for example, be inverted and input directly to a resistor in series with the base of transistor 52.

Resistor 50, which is the highest value of resistance required of transistor 52 over the power supply voltage $V_{CC}$ range, acts to reduce the current required to be supplied by transistor 52. This increases the effective beta of transistor 52, reducing the required base current even further. The effect is to reduce the overhead power required of the control circuit 42.

In another embodiment of the invention, transistors 52 and 54, and resistor 56, may be replaced by a field effect transistor (either PFET or NFET), the source-drain current path of which is connected between the $V_{CC}$ terminal and node $V_{CR}$, and the gate of which receives $V_{CCC}$. Of course, in such case, the appropriate phase and signal amplitude for $V_{CCC}$ would need to be adjusted appropriately.

The first variable control signal, $V_{CS}$, from control signal generator 40, is input to the base of transistor 22 in logic circuit 1 of the preferred embodiment as shown in FIG. 4. Control signal $V_{CS}$ varies the current in the collector-emitter path of transistor 22 and hence through transistors 12, 14, 16 and 18, and indirectly through transistors 10 and 20. As long as $V_{CS}$ is controlling transistor 22, and as long as the voltage at node 60 is maintained at a constant level by way of $V_{CCC}$, the voltages and currents at the outputs of the CSEF circuit will be maintained at a substantially constant, known level, thus permitting the signal swing at the outputs to be reduced to a minimum, because noise has been reduced to a minimum.

Figure 5:
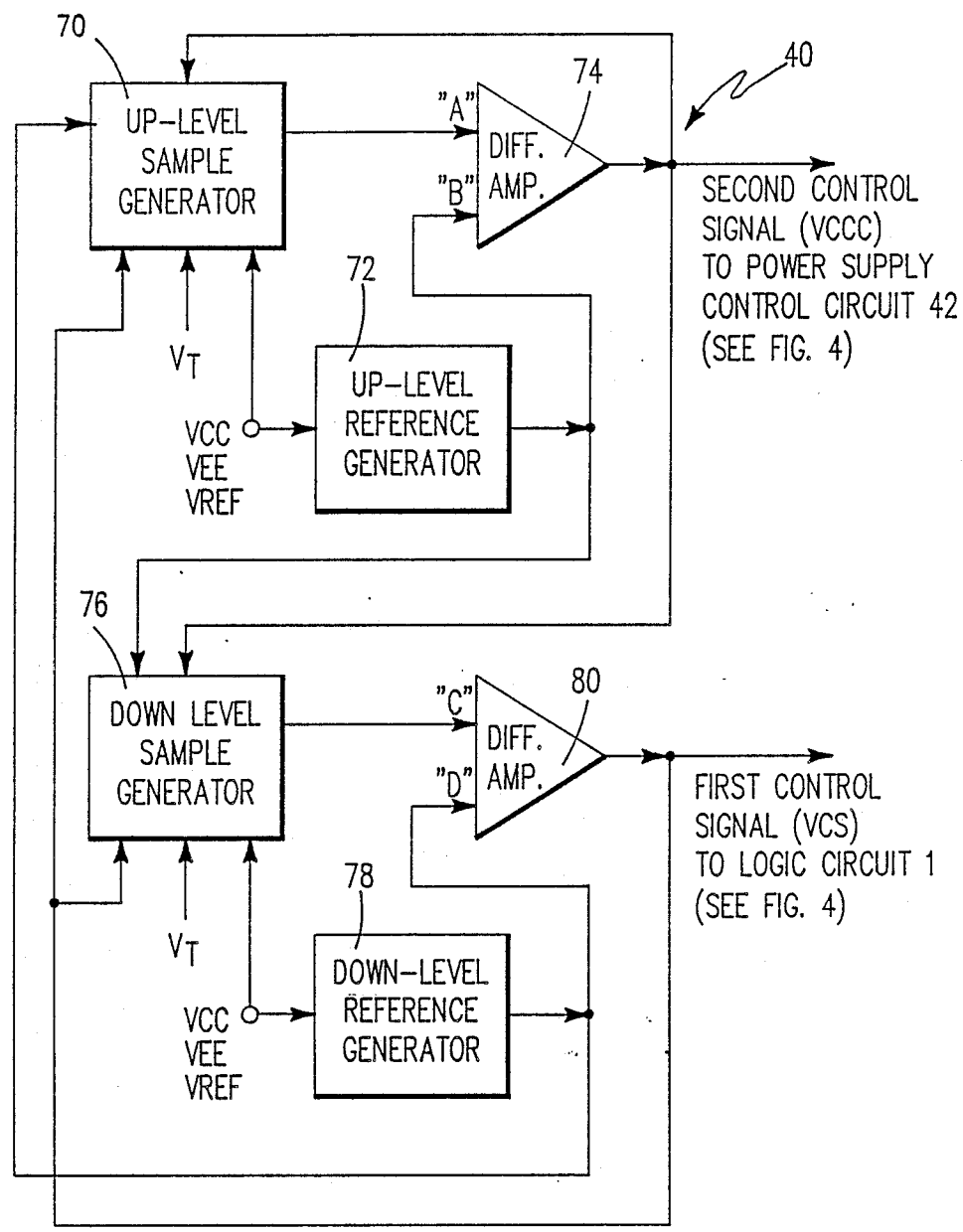
FIG. 5 is a block diagram of one embodiment of a feedback circuit of the present invention which may be utilized to generate the control signals $V_{CCC}$ and $V_{CS}$ for input to the circuits of FIGS. 3 and 4.

FIG. 5 shows the control signal generator 40 of FIG. 3 of the present invention, which generator is used to generate the control signals $V_{CCC}$ and $V_{CS}$. In FIG. 5, an UP-level sample generator 70 and an Up level reference generator 72 are provided, each having an output that is fed into a first differential amplifier 74. A DOWN-level sample generator 76 and a DOWN-level reference generator 78 are also provided, each having an output that is fed into a second differential amplifier 80.

UP-level sample generator 70 is intended to generate a logical UP output signal representative of the actual level of an UP output signal generated by a typical CSEF circuit in operation in a typical environment (for example, on a semiconductor chip in a central processing unit). Sample generator 70 may, for instance, be the logic circuit 1, together with control circuit 42, of FIG. 4, with one or more of its input transistors constantly "off", i.e., tied to the DOWN position. These inputs could be taken from the DOWN-level reference generator 78. The UP-level output of the sample generator 70 may, in one embodiment, be on the order of $+350$ to $-50$ millivolts when the feedback loop is open. When closed, the output voltage will be the same as the reference generator output.

The UP-level reference generator 72 of FIG. 5 is used to provide a standard reference UP level logical signal (i.e., a constant UP level representative of the "ideal" UP logical output level desired for the particular configuration and environment intended for the CSEF circuit). A typical voltage at the output of reference generator 72 might, for example, be on the order of $+150$ millivolts. A specific embodiment of reference generator 72 could, for example, be a and G. E. Smith, III, the inventors of the present invention, entitled "Reference Generator Insensitive to Power Supply Variations," *IBM Technical Disclosure Bulletin*, Vol. 30, No. 10, Mar. 1988, p. 27 and illustrated herein by FIG. 6.

Differential amplifier 74, which receives as its inputs the outputs of sample generator 70 and reference generator 72, has as its output the second control signal $V_{CCC}$. Differential amplifier 74 could be a differential bipolar amplifier such as the one described in the above-mentioned article by Cavaliere and Smith and shown in FIG. 7 herein. The gain required for amplifier 74 is determined by the amount of change one chooses to allow in a DC output logic level of the CSEF logic circuit 1. In the present embodiment, it has been found that a gain of 100 is satisfactory. The $V_{CCC}$ output of amplifier 74 is input to the power supply control circuit 42 (FIG. 3), specifically to the base of transistor 54 (FIG. 4). This $V_{CCC}$ signal controls the absolute value of the UP level of the CSEF logic circuit, and is also fed back into both sample generators 70 and 76 to form a closed loop for tighter control of both control signals $V_{CCC}$ and $V_{CS}$, and consequently more effective, independent control of both the UP and DOWN output levels of the logic circuit.

A similar arrangement exists in this embodiment with respect to DOWN-level sample generator 76, DOWN-level reference generator 78 and differential amplifier 80. Sample generator 76 may, for instance, be the standard CSEF logic circuit 1 (with control circuit 42) of FIG. 4, with one or more of its input transistors constantly "on", i.e., tied to the UP level. These inputs could be taken from the UP level reference generator 72. In this way, sample generator 76 generates a DOWN level output signal representative of the actual DOWN level output signal generated by a typical CSEF logic circuit in the particular operating environment. This DOWN-level output may be on the order of $-200$ to $-300$ millivolts in the present embodiment.

Figure 6:
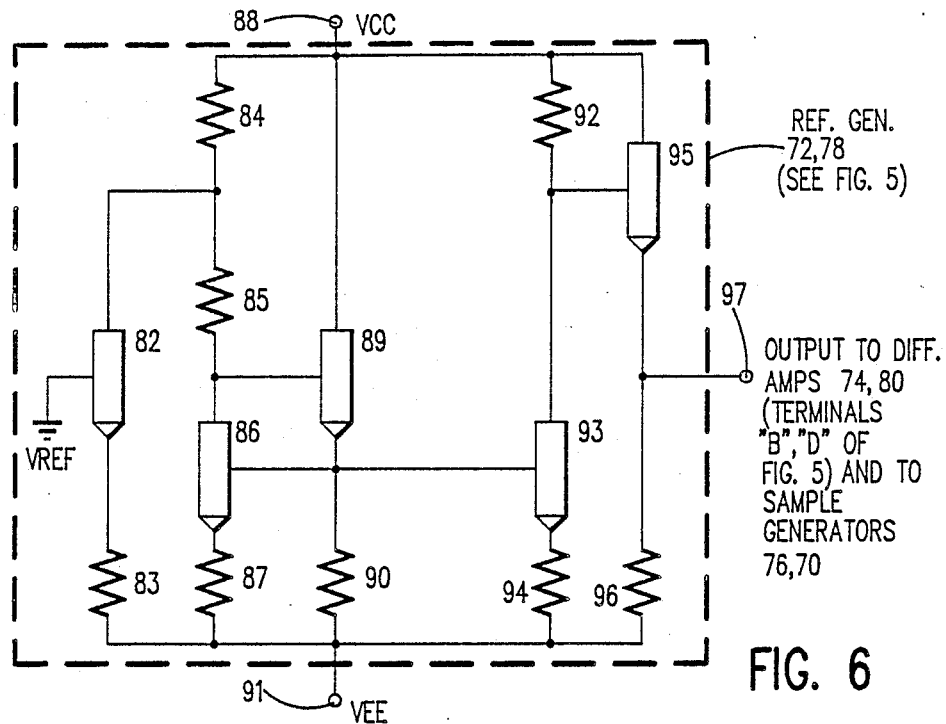
FIG. 6 is a schematic circuit diagram of one embodiment of the reference generators 72 and 78 of FIG. 5.

DOWN-level reference generator 78, which may, for example, be a circuit such as that described in the above-mentioned Cavaliere and Smith article and shown in FIG. 6 herein, produces a standard reference logical DOWN signal representative of the "ideal" DOWN level desired for the particular configuration and environment of the CSEF logic circuit. In a typical environment, the DOWN level signal could be on the order of $-230$ millivolts.

Figure 7:
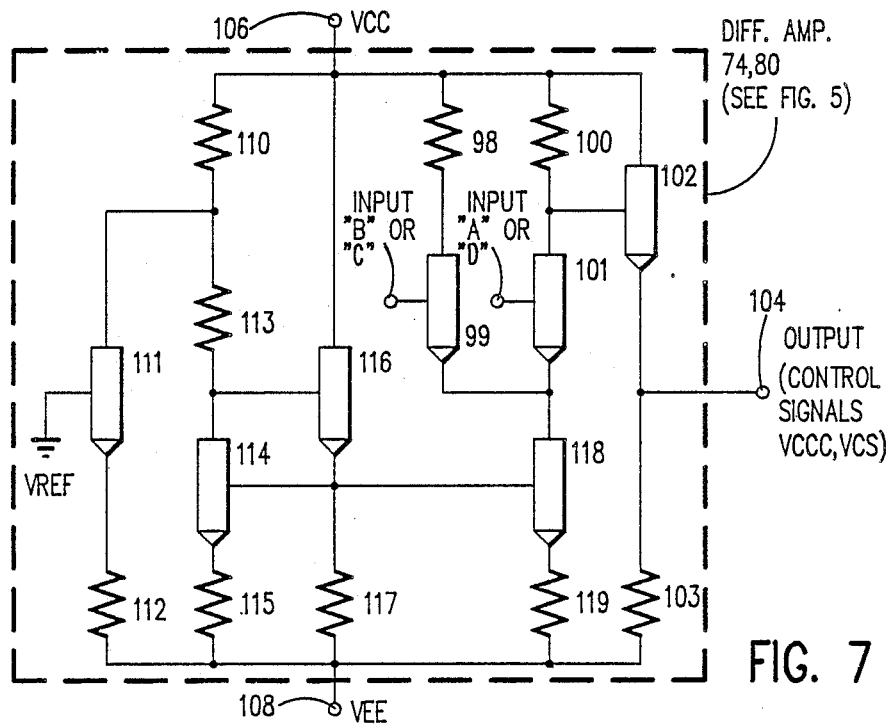
FIG. 7 is a schematic circuit diagram of one embodiment of the differential amplifiers 74, 80 of FIG. 5.

The outputs of sample generator 76 and reference generator 78 are applied to the input of differential amplifier 80, which could be a differential bipolar amplifier, as in FIG. 7, with a gain, for example, of 100. Amplifier 80 has an output which is the second control signal ($V_{CS}$) for input to the CSEF logic circuit 1 (FIG. 3), specifically to the base of transistor 22 (FIG. 4). This $V_{CS}$ signal controls the difference between the UP level and the DOWN level of sample generators 70 and 76 to form a closed loop for tighter control of both the $V_{CS}$ and the $V_{CCC}$ signals, and consequently more effective, independent control of both the UP and DOWN output levels of the logic circuit.

The feedback arrangement of the control signal generator 40 (FIG. 5) thus provides a means to vary the control voltages $V_{CCC}$ and $V_{CS}$ in such a manner as to compensate for fluctuations in the main power supply voltages $V_{CC}$, $V_{EE}$ and $V_T$. This control arrangement also helps compensate for fluctuations in temperature and in parameters of various devices in the CSEF circuits through the use of the sample generators. The nominal output signal swing may thus be reduced without reducing the worst case signal swing. The UP-level and DOWN-level reference generators provide UP and DOWN-level standards that are independent of $V_{CC}$, $V_{EE}$, $V_T$, temperature and device parameters, but that are directly proportional to $V_{Ref}$.

FIG. 6 is an example of a specific embodiment, described in the above-mentioned Cavaliere and Smith article, which may be employed for the reference generators 72 and 78 of FIG. 5. FIG. 7 shows a circuit, also described in the above-mentioned article, which could be used as the differential amplifiers 74 and 80 of FIG. 5.

In FIG. 6, power supply voltages $V_{CC}$ and $V_{EE}$ are input to terminals 88 and 91, respectively. Coupled to and extending between these two terminals are several circuit paths which, in one embodiment, include the following elements in series connection, as follows: First path: a resistor 84, the collector-emitter path of a transistor 82 and a resistor 83. Second path: resistor 84, a resistor 85, the collector-emitter path of a transistor 86 and a resistor 87. Third path: the collector-emitter path of a transistor 89 and a resistor 90. Fourth path: a resistor 92, the collector-emitter path of a transistor 93 and a resistor 94. Fifth path: the collector-emitter path of a transistor 95 and a resistor 96. The base of transistor 82 receives power supply voltage $V_{Ref}$, which is ground in this embodiment. The bases of transistors 86 and 93 are both coupled to the emitter of transistor 89. The bases of transistors 89 and 95 are coupled to the collectors of transistors 86 and 93, respectively.

For optimal operation, the $V_{BE}$ of transistor 82 should be equal to the $V_{BE}$ of transistor 89, and the $V_{BE}$ of transistor 93 should be equal to the $V_{BE}$ of transistor 95. In addition, the resistance of resistor 83 should be equal to the resistance of resistor 84, and the ratio of resistor 92 to resistor 94 should equal the ratio of resistors 84, plus 85, plus 87, to resistor 87.

Output terminal 97 of FIG. 6, which is taken from the emitter of transistor 95, supplies the output UP-level reference signal for input to amplifier 74 of FIG. 5, or the DOWN-level reference signal for input to amplifier 80 of FIG. 5. These logic level reference signals are independent of $V_{CC}$, $V_{EE}$, $V_T$, temperature and device parameters but track $V_{Ref}$.

FIG. 7 shows a differential amplifier which could serve either as differential amplifier 74 or differential amplifier 80 of FIG. 5. Although the general appearance of FIG. 7 is similar to that of FIG. 6, the circuits perform quite different functions. Power supply voltages $V_{CC}$ and $V_{EE}$ are input to terminals 106 and 108, respectively. Coupled to and extending between these two terminals are several circuit paths which, in one embodiment, include the following elements in series connection, as follows: First path: a resistor 110, the collector-emitter path of a transistor 111 and a resistor 112. Second path: resistor 110, a resistor 113, the collector-emitter path of a transistor 114 and a resistor 115. Third path: the collector-emitter path of a transistor 116 and a resistor 117. Fourth path: a resistor 98, the collector-emitter path of a transistor 99, the collector-emitter path of a transistor 118 and a resistor 119. Fifth path: a resistor 100, the collector-emitter path of a transistor 101, the collector-emitter path of transistor 118 and resistor 119; Sixth path: the collector-emitter path of a transistor 102 and resistor 103. The base of transistor 111 receives power supply voltage $V_{Ref}$, which is ground in this embodiment. The bases of transistors 114 and 118 are both coupled to the emitter of transistor 116. The bases of transistors 116 and 102 are coupled to the collectors of transistors 114 and 101, respectively. Transistor 118 operates as a constant current source.

For optional operation, resistors 98 and 100 should be equal, and resistors 110, 112 and 113 should be equal. In addition, the ratio of resistor 98 (or 100) to 119 should equal the ratio of resistor 110, plus resistor 113, plus twice resistor 115, to resistor 115.

When the circuit of FIG. 7 serves as differential amplifier 74 of FIG. 5, then input "A" from UP-level sample generator 70 is applied to the base of transistor 101, and input "B", from UP-level reference generator 72, is applied to the base of the transistor 99. The output, namely control signal $V_{CCC}$, is taken from the emitter of transistor 102.

An analogous arrangement exists when the circuit of FIG. 7 is used for differential amplifier 80 of FIG. 5. In that case, input "C" from DOWN-level sample generator 76 is applied to the base of transistor 99, and input "D" from DOWN-level reference generator 78 is applied to the base of transistor 101. The output for this arrangement is control signal $V_{CS}$, taken from the emitter of transistor 102. The elements on the left-hand side of the circuit of FIG. 7 (namely, transistors 111, 113, 114, 116 and 118, and resistors 110, 112, 113, 115, 117 and 119 help keep the output free of extraneous fluctuations, by virtue of a stable constant current source configuration. The voltage at the output of the circuit of FIG. 7 is proportional only to the difference between the voltage at the two inputs, the circuit being independent of $V_{CC}$, $V_{EE}$, $V_T$, temperature and device parameters.

The operation of one embodiment of the present invention will now be described. Consider first the $V_{CC}$ power supply voltage. If a transient drop occurs in this voltage, this drop will cause the outputs of sample generator 70 and sample generator 76 (FIG. 5) to fluctuate downward momentarily, a fluctuation which is amplified by the differential amplifiers 74 and 80. The outputs of the reference generators 72, 78 are not affected because their outputs are independent of $V_{CC}$ and $V_{EE}$. Accordingly, the control signal $V_{CCC}$ at the output of amplifier 74 is increased by an amount which is a function of the $V_{CC}$ and $V_{EE}$ fluctuation, and control signal $V_{CS}$ at the output of amplifier 80 is decreased by an amount which is also a function of the $V_{CC}$ and $V_{EE}$ of fluctuation.

The $V_{CCC}$ signal, fed into the base of transistor 54 (FIG. 4), will, in turn, cause a corresponding almost instantaneous upward fluctuation in the current gated through transistor 54, and thus through the base of transistor 52. This fluctuation, in turn, will cause an almost instantaneous downward fluctuation in the resistance in the emitter-collector current path of transistor 52. In this example of this embodiment, the dynamic resistance of transistor 52 will typically vary from near zero ohms to near infinity as the power supply voltage $V_{CC}$ varies from 200 millivolts above to 200 millivolts below a nominal "centered" $V_{CC}$ value of the UP level at the outputs OUT$_1$ and OUT$_2$ extremely close to its ideal reference level. When $V_{CC}$ is at its nominal value (i.e., when the circuit is centered), then the emitter-collector resistance of transistor 52 will be approximately equal to the resistance of resistor 50. If voltage $V_{CC}$ rises, transistor 52 will begin to turn more off (i.e. draw less current), thus increasing the emitter-collector resistance accordingly, which increases the voltage drop across $V_{CC}$ to $V_{CR}$.

Transistors 52 and 54 have a response time which is fast enough to reflect, almost instantaneously, variations in control signal $V_{CCC}$ which, in turn, varies almost instantaneously with variations in power supply voltages $V_{CC}$ and $V_{EE}$. Resistor 56 operates together with transistor 54 to provide current amplification and control to the base of transistor 52, to help contribute to the gain of the feedback loop. As a result, the logic circuit output levels are also substantially independent of variations in the voltage $V_T$.

In addition, $V_{CS}$ varies almost instantaneously with variations in $V_{EE}$ For example, if $V_{EE}$ becomes more positive, $V_{CS}$ will be increased.

An additional feature of the present invention is the low overhead power consumption required by the regulation circuits (control signal generator 40 and control circuit 42). Transistor 52 (FIG. 4) is of the PNP type in the present embodiment because use of a PNP type greatly reduces the power consumed by the control circuit 42. The additional power required per CSEF logic circuit is given by:

$$\frac{(V_{CC} - V_T)(i_{sw}/2)}{(\beta_{PNP})(\alpha_{NPN})}$$

where $i_{sw}$ is the current switch current flowing through transistor 52, $\beta$ is the base current to collector current gain for transistor 52, and $\alpha$ is the ratio of the collector current to the emitter current for transistor 54. The $i_{sw}$ term is divided by 2 because resistor 50 typically provides half of the current of the current switch. Because of this arrangement, the control signal generator 40 adds only a small power overhead when distributed over many logic circuits. The same power supply used for the logic circuits could also be used for the sample generators, reference generators and differential amplifiers.

It has been found through simulation that, by using the present invention, the nominal UP and DOWN levels of +150 mv and −220 mv, respectively, at the outputs of the CSEF logic circuit 1 (FIG. 4) can be made to vary by less than 1% as the $V_{CC}$, $V_{EE}$ or $V_T$ voltages vary by up to 20%. Similarly, these output levels vary by less than 1% as the ambient temperature varies from 45° C. to 85° C., and as logic circuit device parameters (e.g., the resistance of resistors 26, 28 and 32, or the $V_{BE}$ of transistors 10, 12, 14, 16, 18, 20, 22) vary over a range of ±20%, provided the corresponding elements of sample generators 70 and 76 (FIG. 5) vary accordingly. In other words, the present invention compensates for all typical semiconductor manufacturing variations in device parameters. This degree of control permits the output levels to be reduced to such an extent that at least a 20% speed improvement over standard CSEF logic circuits may be achieved.

Signal generator 40 (FIG. 5) is typically located on the same chip as the CSEF circuits, to more accurately track changes in circuit device parameters. This permits the two control signals, $V_{CCC}$ and $V_{CS}$, to be distributed to numerous CSEF logic circuits, resulting in lower overhead power per circuit. It is estimated that the number of such logic circuits able to receive these signals from the same generator is in excess of 400.

The control afforded by the present invention permits lower power supply operation, resulting in less power dissipation at the same current for the logic circuit. This, together with the improved performance, results in an improved speed power product over CSEF logic circuits using the same type of devices.

An additional benefit of the present invention is that control circuit 42 (FIG. 4) can filter out some high frequency switching noise (also known as driver induced or $\Delta i$ noise) from the power supply, provided circuit 42, sample generator 70 and differential amplifier 74 are designed to be sufficiently fast. Additional filtering may be obtained if a capacitor is placed at node 60 of circuit 42.

In the manner described above, the present invention permits the output signal swing of a typical current switch logic circuit to be reduced to a minimum, because the up and down levels are made substantially insensitive to power supply voltage fluctuations, junction temperature fluctuations and absolute device parameter fluctuations. Thus, maximum speed and minimum power dissipation are achieved simultaneously. The present invention thus solves an important problem faced by high performance logic circuit designers, namely how to compensate effectively for the environmentally-caused fluctuations described above. This permits more or equal noise margin for a smaller signal.

While the present invention has been particularly shown and described with reference to preferred embodiments therefor, it will be understood by those skilled in the art that the foregoing and other changes in form and detail may be made therein without departing from the spirit and scope of the present invention.

We claim:

1. A logic circuit network for producing an adjustable first logic level and a different adjustable second logic level in response to at least one input signal, comprising:
   a logic circuit having at least one input terminal, at least one output terminal, at least one power supply terminal for receiving power, circuit components having parameters and a first control terminal;
   a control circuit coupled to the logic circuit and having a second control terminal;
   means for independently generating a first control signal and a second control signal responsive to changes in the power supply, temperature and logic circuit component parameters; and
   means for supplying the control signals to the first and second control terminals, respectively, so as to maintain the first and second logic levels at different predetermined reference levels despite changes in the power supply, temperature and logic circuit component parameters.

2. The logic circuit network of claim 1 in which the logic circuit comprises a current switch emitterfollower circuit.

3. The logic circuit network of claim 2 in which the control circuit includes a controllable dynamic resistance.

4. The logic circuit network of claim 1, in which the control circuit comprises:
   a load resistor;
   a controllable dynamic resistance connected across the resistor, comprising one or more transistors;
   a controllable current source comprising one or more transistors, connected to the dynamic resistance; and
   means for controlling the current source and the dynamic resistance by the second control signal.

5. The logic circuit network of claim 1, in which the means for generating the control signals comprises a control signal generator having two outputs, two sample generators, two reference generators and two differential amplifiers, the outputs of the differential amplifiers being applied to each sample generator and the output of each sample generator being applied to the input of a different respective differential amplifier and the output of each reference generator being applied to the input of a different corresponding differential amplifier, the outputs of the differential amplifiers being the outputs of the control signal generator, the outputs of the control signal generator being the first control signal and the second control signal.

6. The logic circuit network of claim 5 in which each sample generator comprises a current switch emitterfollower circuit with its inputs fixed at a predetermined logic reference level.

7. The logic circuit network of claim 1 in which the first control signal is applied to more than one logic circuit and the second control signal is applied to more than one control circuit.

8. The logic circuit network of claim 5 in which each reference generator comprises:
first and second terminals for receiving first and second power supply voltages, respectively, and an output terminal;
first, second, third, fourth and fifth transistors; and
first, second third, fourth, fifth, sixth, seventh and eighth resistors;
the resistors and the collector-emitter paths of the transistors being connected to each other and to and between the first and second terminals, respectively, in series connections, as follows:
first resistor, first transistor and second resistor;
first resistor, third resistor, second transistor and fourth resistor;
third transistor and fifth resistor;
sixth resistor, fourth transistor and seventh resistor; and
fifth transistor and eighth resistor; the bases of the transistors being connected as follows:
the base of the first transistor connected to a third power supply voltage;
the bases of the second and fourth transistors connected to the emitter of the third transistor; and
the base of the fifth transistor connected to the collector of the fourth transistor;
the output terminal being connected to the emitter of the fifth transistor.

9. The logic circuit network of claim 5 in which each differential amplifier comprises:
first and second terminals for receiving first and second power supply voltages, respectively, two input terminals and an output terminal;
first, second, third, fourth, fifth, sixth and seventh transistors; and
first, second third, fourth, fifth, sixth, seventh, eighth and ninth resistors;
the resistors and the collector-emitter paths of the transistors being connected to each other and to and between the first and second terminals, respectively, in series connections, as follows:
first resistor, first transistor and second resistor;
first resistor, third resistor, second transistor and fourth resistor;
third transistor and fifth resistor;
sixth resistor, fourth transistor, fifth transistor and seventh resistor; and
eight resistor, sixth transistor, fifth transistor and seventh resistor; and
seventh transistor and ninth resistor;
the bases of the transistors being connected as follows:
the base of the first transistor connected to a third power supply voltage;
the bases of the second and fourth transistors connected to the emitter of the third transistor;
the bases of the fourth and sixth transistors connected to the input terminals; and
the base of the seventh transistor connected to the collector of the fourth transistor;
the output terminal being connected to the emitter of the seventh transistor.

10. The logic circuit network of claim 4 in which the controllable dynamic resistance comprises a PNP transistor having its emitter coupled to a power supply voltage source, its collector coupled to the logic circuit and its base coupled to the collector of a second control transistor.

11. The logic circuit network of claim 10 in which the second control transistor comprises an NPN transistor having its collector coupled to the base of the PNP transistor, its emitter coupled through a resistor to a power supply voltage source and its base configured to receive the second control signal.

12. The logic circuit network of claim 3 in which the controllable dynamic resistance comprises a field effect transistor, the source-drain current path of which is connected between the power supply terminal and the logic circuit, and the gate of which is connected to receive the second control signal.

13. The logic circuit network of claim 2, in which the current switch emitter-follower circuit comprises:
a controllable logic circuit current source;
at least one input transistor with its collector connected to an output current node, its base connected to an input line and its emitter connected to the logic circuit current source;
a first resistance connected to the collector of the at least one input transistor;
a reference transistor with its collector connected to a complement output current node, its base connected to a reference voltage source, and its emitter connected to the logic circuit current source;
a second resistance connected to the collector of the reference transistor; and
a first output transistor and a second output transistor, each producing binary output logic signal levels.

14. The logic circuit network of claim 13, in which the logic circuit current source is a transistor with its base configured to receive the second control signal.

15. The logic circuit network of claim 13 in which the output signal levels are asymmetrical with respect to a reference voltage.

16. A current switch emitter follower logic circuit network for producing an adjustable first logic level and a different adjustable second logic level in response to at least one input signal, comprising:
a current switch emitter follower logic circuit having at least one input terminal, at least one output terminal, at least two power supply terminals for receiving power from a power supply, circuit components having parameters and a first control terminal;
a control circuit coupled to the logic circuit and having a second control terminal;
means for independently generating a first control signal and a second control signal responsive to changes in the power supply, temperature and logic circuit component parameters; and
means for supplying the control signals to the first and second control terminals, respectively, so as to maintain the first and second logic levels at different predetermined reference levels despite changes in the power supply, temperature and logic circuit component parameters.

17. The logic circuit network of claim 16 in which the control circuit includes a controllable dynamic resistance.

18. A method for producing an adjustable first logic level and a different adjustable second logic level in response to at least one input signal, comprising the steps of:
generating a first control signal and a second control signal, each of which is a function of at least one power supply voltage, temperature and parameters of circuit devices; and independently controlling the first and second logic levels by way of the first and second control signals, respectively, so as to maintain the first and second logic levels at different predetermined reference levels.

19. The method of claim 18 in which the logic level controlling step includes the step of varying the resistance between the power supply and a control node in response to the second control signal so as to maintain the control node at a constant voltage.

20. The method of claim 19 in which the step of varying the resistance includes the step of varying the voltage at the base of a transistor.

* * * * *

UNITED STATES PATENT AND TRADEMARK OFFICE
CERTIFICATE OF CORRECTION

PATENT NO.   :   4,894,562

DATED        :   January 16, 1990

INVENTOR(S)  :   Joseph R. Cavaliere and George E. Smith, III

It is certified that error appears in the above-identified patent and that said Letters Patent is hereby corrected as shown below:

Cover Sheet, Item [21]:   Change "Appl. No. 252,489" to -- Appl. No. 252,480 --

In column 3, line 26:   After "to be" insert -- maintained around a center reference voltage in --.

Signed and Sealed this

First Day of January, 1991

Attest:

HARRY F. MANBECK, JR.

Attesting Officer

Commissioner of Patents and Trademarks

REEXAMINATION CERTIFICATE (1980th)

United States Patent [19]

Cavaliere et al.

[11] B1 4,894,562

[45] Certificate Issued Apr. 20, 1993

[54] CURRENT SWITCH LOGIC CIRCUIT WITH CONTROLLED OUTPUT SIGNAL LEVELS

[75] Inventors: Joseph R. Cavaliere, Hopewell Junction; George E. Smith, III, Wappingers Falls, both of N.Y.

[73] Assignee: International Business Machines Corporation, Armonk, N.Y.

Reexamination Request:
No. 90/002,580, Feb. 14, 1992

Reexamination Certificate for:
| | |
|---|---|
| Patent No.: | 4,894,562 |
| Issued: | Jan. 16, 1990 |
| Appl. No.: | 252,489 |
| Filed: | Oct. 3, 1988 |

[51] Int. Cl.[5] ............... H03K 19/086; H03K 19/003; H03K 17/14; H03K 17/16
[52] U.S. Cl. .................................. 307/455; 307/363; 307/542; 307/555; 307/567
[58] Field of Search ............ 307/455, 363, 443, 491, 307/494, 296.1, 296.6

[56] References Cited

U.S. PATENT DOCUMENTS

| | | | |
|---|---|---|---|
| 3,546,481 | 12/1970 | Talley | 307/360 |
| 3,787,734 | 1/1974 | Dorler et al. | 307/203 |
| 4,677,320 | 6/1987 | Hannington | 307/475 |
| 4,686,395 | 8/1987 | Sato et al. | 307/455 |
| 4,728,818 | 3/1988 | Chengson et al. | 307/272.2 |
| 4,823,028 | 4/1989 | Lloyd | 307/355 |
| 4,835,455 | 5/1989 | Coddington et al. | 323/314 |

*Primary Examiner*—J. Zazworsky

[57] ABSTRACT

A current switch emitter-follower logic circuit allows both the UP output logic level and the DOWN output logic level to be independently controlled with respect to a fixed reference voltage so as to permit very small output level swings. A feedback circuit generates two different control signals which are independently variable and are input to a control circuit and to a logic circuit to compensate for fluctuations in power supply voltages, temperature and circuit parameters. These control signals are applied to a variable current source within the logic circuit and to a dynamic resistance within the control circuit to compensate almost instantaneously to fluctuations in power supply voltage, temperature or circuit device parameters, maintaining the logic circuit output levels close to reference levels so as to permit small output signal swings. The output logic levels need not be symmetrical around a central reference point.

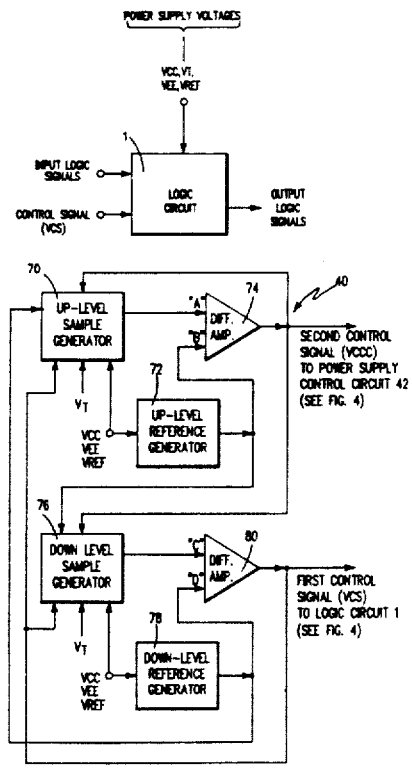

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 4 and 10-17 is confirmed.

Claims 1-3 and 18-20 are cancelled.

Claims 5 and 7 are determined to be patentable as amended.

Claims 6, 8 and 9, dependent on an amended claim, are determined to be patentable.

5. The logic circuit network of claim 1, in which the means for generating the control signals comprises a control signal generator, *said control signal generator* having two outputs, two sample generators, two reference generators and two differential amplifiers, the outputs of the differential amplifiers being applied to each sample generator and the output of each sample generator being applied to the input of a different respective differential amplifier and the output of each reference generator being applied to the input of a different corresponding differential amplifier, *and* the outputs of the differential amplifiers being the outputs of the control signal generator, *whereby* the outputs of the control signal generator [being] *are* the first control signal and the second control signal.

7. The logic circuit network of claim 1 [in which] *wherein* the first logic control signal is [applied to more than one] *supplied to the first control terminal of a plurality of said* logic [circuit] *circuits* and the second control signal is [applied to more than one] *supplied to the second control terminal of plurality of said* control [circuit] *circuits.*

* * * * *